United States Patent [19]

Hilson et al.

[11] 4,350,618

[45] Sep. 21, 1982

[54] THICK FILM CONDUCTORS FOR USE IN MICROELECTRONIC PACKAGING

[75] Inventors: David G. Hilson; Gary W. Johnson, both of Norwalk, Conn.; Ronald J. Schoonejongen, Lake Carmel, N.Y.

[73] Assignee: Electro Materials Corp. of America, Mamaroneck, N.Y.

[21] Appl. No.: 94,900

[22] Filed: Nov. 16, 1979

[51] Int. Cl.$^3$ .................... H01B 1/02; H01L 23/48; C09D 5/10

[52] U.S. Cl. .................... 252/514; 252/518; 357/67; 357/68; 106/1.13; 106/1.15; 106/1.21

[58] Field of Search .................... 357/67, 68; 252/512, 252/514, 518; 106/1.13, 1.15, 1.21

[56] References Cited

U.S. PATENT DOCUMENTS 4,187,201  2/1980  Hilson et al. .................... 252/514

FOREIGN PATENT DOCUMENTS 1062378   7/1965  United Kingdom .
1152502   5/1967  United Kingdom .
1260023  10/1969  United Kingdom .

*Primary Examiner*—E. Wojciechowicz
*Attorney, Agent, or Firm*—Amster, Rothstein & Engelberg

[57] ABSTRACT

In a microelectronic package of the type where Si-based integrated circuits are eutectically attached to a Pd/Au-based thick film conductor, a method of reducing the potential for thermal runaway is taught. The method involves increasing the surface area of the Pd to lower the Vbe rating. This reduces the potential for thermal runaway in subsequent integrated circuit operation. It has also been found that increasing the particle size of the Au component further decreases the Vbe rating.

5 Claims, No Drawings

THICK FILM CONDUCTORS FOR USE IN MICROELECTRONIC PACKAGING

A microelectronic package is an arrangement of integrated circuit chips attached to a ceramic substrate and containing a suitable inter-connection scheme, for example a deposit metalization pattern, or thick film conductor. The current invention relates to thick film conductors useful to prevent a degradation in integrated circuit performance known as thermal runaway.

Pd doped Au thick film conductors are used in many circuit applications where aluminum wire bonds complete the required connections between the microelectronic package and other circuit components. The presence in the Au film of small percantages of Pd (ranging from 1% to about 3%) is known to those skilled in the art to be advantageous in preventing adhesion degradation of aluminum wire bonds during thermal aging.

An important process involved in microelectronic package construction is known as eutectic die attachment. This is a process by which an Si-based integrated circuit is placed on an Au-based thick film conductor which itself is located on a suitable substrate. The combination is raised to a temperature of approximately 370° C., causing an Au/Si eutectic bond to form.

Unfortunately, as those skilled in the art are well aware, the use of the eutectic die attachment process is often incompatible with Pd doped Au conductors. It has been found that use of eutectic die attachment in association with such Pd doped Au films leads the integrated circuit, during subsequent operation, to exhibit thermal runaway.

Thermal runaway is an unstable condition in the semi-conductor composition which manifests itself as a rapid, unbounded increase in collector current which persists until failure occurs. For a further discussion of the problem of thermal runaway, see Thornton, et al., *Characteristics and Limitations of Transistors*, Section 2, SEMICONDUCTOR ELECTRONICS EDUCATION COMMITTEE, VOLUME 4 (John Wiley & Sons, Inc.).

Because thermal runaway has been found to occur when eutectic die attachment has been made on to Pd doped Au conductors, it could become necessary to conduct the additional manufacturing step of printing a pure Au conducting area specifically for eutectic die attachment. This extra step causes additional expense.

The potential for thermal runaway can be determined by taking a DC voltage measurement across the forward-biased base to emitter junction of the integrated circuit. This voltage (Vbe) is measured in millivolts, and the importance of this parameter in connection with the phenomenon of thermal runaway is well known to those skilled in the art. See, for example, M. H. McLaughlin, et al., *Thermal Chip Evaluation of IC Packaging*.

In the applications under consideration, those skilled in the art understand that the lower the Vbe rating, the smaller the chances for thermal runaway.

It is accordingly an object of the present invention to provide a thick film conductor for a microelectronic package which exhibits Vbe ratings generally lower than 250 millivolts.

It is a further object of the present invention to create a Pd doped Au thick film conductor which is adaptable for eutectic die attachment.

It is a further object of the present invention to provide a thick film conductor which distinctly reduces the chances of thermal runaway in microelectronic packages of the type under consideration.

It is yet another object of the present invention to formulate a thick film conductor which is susceptible to easy and relatively inexpensive manufacture.

It has been discovered that increasing the surface area of the Pd component of a Pd/Au conductor lowers the Vbe readings. It has also been discovered that increasing the particle size of the Au component further lowers the Vbe rating. The examples displayed below will show these improved Vbe characteristics and will show the unexpected and surprisingly beneficial results obtained by use of the present invention.

The conductor paste formulation comprises by weight about 7.6% vehicle, about 81.2% Au, about 1.3% Pd, about 0.4% Pt, about 1.3% ZnO, and the remainder comprising $Bi_2O_3$ and a conventional powdered glass frit in the ratio of about 2 to 1.

The 70% to 90% metal content is typical of thick film conductors, and those skilled in the art understand that to attempt to use a much less metallic system would have detrimental effects on conductivity.

The vehicle can be any one of a number of commercially available organic screening agents; for example, a solvent such as terpineol and a resin such as ethyl cellulose are formed in a mixture comprising about 10% by weight of ethyl cellulose and 90% by weight terpineol. Those skilled in the art know the various vehicles which can be used in this type of application, and the vehicle need not be further explained.

The powdered glass frit is also commercially available. Those skilled in the art also know that a powdered glass frit of the lead boro-silicate type can be used in this type of application; and accordingly, the glass frit need not be further discussed.

In forming the thick film conductor, the paste described above is deposited on a substrate and heated to a temperature sufficient to burn off the vehicle, leaving the thick film conductor bonded to the substrate. The conductor then has a composition of, by weight, about 87.88% Au, 1.41% Pd, 0.43% Pt, 1.41% ZnO and the remainder being $Bi_2O_3$ and glass frit in a ration of about 2 to 1.

The following examples will show that where conductor formulation was otherwise held constant, Vbe proved to be inversely proportional both to the size of the surface area of the Pd and to the particle size of the Au.

EXAMPLE 1

A conductor was manufactured and composed as described above. As shown in Table 1, with all other parameters remaining constant, an increase in surface area of Pd from 4.38 meters$^2$/gram to 5.22 meters$^2$/gram resulted in a reduction in average Vbe from 365 millivolts to 327 millivolts. A further increase to 25 meters$^2$/gram resulted in an average Vbe of 276 millivolts. It appears that increasing the surface area of the Pd to at least about 5 meters$^2$/gram is necessary to achieve the desired reduction in Vbe.

TABLE 1

| Lot No. | Au Characteristics | | | Pd Characteristics | | | Average Vbe (Millivolts) |
| --- | --- | --- | --- | --- | --- | --- | --- |
| | Sur. Area ($M^2/g$) | Part. Size ($\mu$) | Tap Dens. (g/cc) | Sur. Area ($M^2/g$) | Part. Size ($\mu$) | Appar. Dens. ($g/in^3$) | |
| S100179A | .63 | 1.73 | 6.56 | 4.38 | 0.51 | 8 | 365 |
| S100179 | .63 | 1.73 | 6.56 | 5.22 | 0.39 | 8.2 | 327 |
| S102579 | .63 | 1.73 | 6.56 | 25 | .1–.3 | 3–7 | 276 |

The data compiled herein demonstrates that the use of Pd of large surface area sizes can produce improved and beneficial results, and make a commercially superior product than was previously possible.

EXAMPLE 2

A conductor was manufactured and composed as described above. As shown in Table 2 with all other parameters remaining essentially constant, an increase in Au particle size from 1.73$\mu$ to 1.96$\mu$ resulted in a reduction in average Vbe from 327 millivolts to 220 millivolts. A further increase to 4.4$\mu$ resulted in an average Vbe of 218 millivolts. Increasing the particle size from 1.73$\mu$ to 1.96$\mu$ results in a dramatic decrease in Vbe.

TABLE 2

| Lot No. | Au Characteristics | | | Pd Characteristics | | | Aver. age Vbe (Millivolts) |
| --- | --- | --- | --- | --- | --- | --- | --- |
| | Sur. Area ($M^2/g$) | Part. Size ($\mu$) | =Tap Dens. (g/cc) | Sur. Area ($M^2/g$) | Part. Size ($\mu$) | Appar. Dens. ($g/in^3$) | |
| S100179 | .63 | 1.73 | 6.56 | 5.22 | 0.39 | 8.2 | 327 |
| S082979B | .45 | 1.96 | 6.03 | 5.22 | 0.39 | 8.2 | 220 |
| PT112178 | .41 | 4.4 | 6.17 | 4.99 | 0.38 | 7.4 | 218 |

The data compiled herein demonstrates that use of Au of large particle sizes can produce additional improved and beneficial results and make a commercially superior product than was previously possible.

What is claimed is:

1. A thick film conductor suitable for use in association with Si-based integrated circuits in a eutectic die attachment process, said thick film conductor comprising by weight, about 87.88% Au, 1.41% Pd, 0.43% Pt, 1.41% ZnO and the remainder being $Bi_2O_3$ and glass frit in a ratio of about 2 to 1, said Pd having a surface area of at least about five meters$^2$/gram.

2. A thick film conductor in accordance with claim 1 wherein said Pd has a surface area of 5.2 meters$^2$/gram.

3. A thick film conductor in accordance with claim 1 wherein said Pd has a surface area of 25 meters$^2$/gram.

4. A thick film conductor suitable for use in association with Si-based integrated circuits in a eutectic die attachment process, said thick film conductor comprising by weight, about 87.88% Au, 1.41% Pd, 0.43% Pt, 1.41% ZnO, and the remainder being $Bi_2O_3$ and glass frit in a ratio of about 2 to 1, said Au having a particle size of 1.96$\mu$.

5. A thick film conductor suitable for use in association with Si-based integrated circuits in a eutectic die attachment process, said thick film conductor comprising by weight about 87.88% Au, 1.41% Pd, 0.43% Pt, 1.41% ZnO and the remainder being $Bi_2O_3$ and glass frit in a ratio of about 2 to 1, said Au having a particle size of about 4.4$\mu$.

* * * * *